US012095371B1

(12) United States Patent
Gaddam et al.

(10) Patent No.: US 12,095,371 B1
(45) Date of Patent: Sep. 17, 2024

(54) POWER CONVERTER HAVING LEVEL SHIFTER WITH DC SIGNAL PATH

(71) Applicant: Empower Semiconductor, Inc., Milpitas, CA (US)

(72) Inventors: Narendra Nath Gaddam, Milpitas, CA (US); Haritha Chanda, Fremont, CA (US)

(73) Assignee: Empower Semiconductor, Inc., San Jose, CA (US)

( * ) Notice: Subject to any disclaimer, the term of this patent is extended or adjusted under 35 U.S.C. 154(b) by 362 days.

(21) Appl. No.: 17/448,163

(22) Filed: Sep. 20, 2021

Related U.S. Application Data

(60) Provisional application No. 63/080,629, filed on Sep. 18, 2020.

(51) Int. Cl.
*H02M 3/158* (2006.01)
*H03K 3/037* (2006.01)

(52) U.S. Cl.
CPC .......... *H02M 3/1584* (2013.01); *H03K 3/037* (2013.01)

(58) Field of Classification Search
CPC .... H02M 3/1582; H02M 3/156; H02M 3/157; H02M 3/1584; H02M 3/1586; H02M 3/285; H02M 3/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 1/007; H02M 1/0009; H02M 1/08; H02M 3/1588; H02M 7/5395; H02M 1/14; H02M 1/0043; H02J 3/46; H02J 3/38; H03K 3/02; H03K 3/027; H03K 3/037
See application file for complete search history.

(56) References Cited

U.S. PATENT DOCUMENTS

| | | | | |
|---|---|---|---|---|
| 5,723,986 A * | 3/1998 | Nakashiro | ........ | H03K 3/356113 326/63 |
| 7,345,946 B1 * | 3/2008 | Chapman | ............ | G11C 11/4085 365/189.11 |
| 7,480,191 B2 * | 1/2009 | Walker | .................. | H03K 3/037 365/189.11 |
| 8,319,540 B2 * | 11/2012 | Barrow | ............ | H03K 3/356165 327/333 |
| 9,912,335 B2 * | 3/2018 | Kapoor | .......... | H03K 19/018507 |

* cited by examiner

*Primary Examiner* — Jeffrey A Gblende
(74) *Attorney, Agent, or Firm* — Fisher Broyles, LLP

(57) ABSTRACT

A voltage regulator circuit is disclosed. The voltage regulator circuit includes a level shifter circuit. The level shifter circuit includes first and second nodes that each switch between a first low voltage and a first high voltage, third and fourth nodes that each switch between a second low voltage and a second high voltage, where the second high voltage is different from the first high voltage. The level shifter circuit also includes a DC path circuit connected between the first and third nodes, and arranged to selectively conduct a current between the first and third nodes.

20 Claims, 3 Drawing Sheets

POWER CONVERTER HAVING LEVEL SHIFTER WITH DC SIGNAL PATH

CROSS-REFERENCE TO RELATED APPLICATION

This application claims the benefit of U.S. Provisional Patent Application No. 63/080,629, titled "POWER CONVERTER HAVING LEVEL SHIFTER WITH DC SIGNAL PATH," filed Sep. 18, 2020, which is hereby incorporated in its entirety and for all purposes.

TECHNICAL FIELD

The present application generally relates to power converter circuits, and more particularly to power converter circuits which use level shifters.

BACKGROUND

Some power converter circuits use level shifters to convert control signals of a first power domain to a second power domain, where the control signals cause high side and low side power switches to be conditionally connected to a switching node. Conventional level shifter circuits allow for indeterminate output states, for example, at start up or during extended non-switching periods. Improved level shifter circuits are needed in the art.

SUMMARY

One inventive aspect is a voltage regulator circuit. The voltage regulator circuit includes a level shifter circuit. The level shifter circuit includes first and second nodes that each switch between a first low voltage and a first high voltage, third and fourth nodes that each switch between a second low voltage and a second high voltage, where the second high voltage is different from the first high voltage. The level shifter circuit also includes a DC path circuit connected between the first and third nodes, and arranged to selectively conduct a current between the first and third nodes.

In some embodiments, the DC path circuit conducts the current from the third node to the first node while a voltage of the first node is equal to the first low voltage, and where the DC path circuit is arranged to be nonconductive while the voltage of the first node is equal to the first high voltage.

In some embodiments, the DC path circuit is a first DC path circuit, and the level shift circuit further includes a second DC path circuit that is connected between the second and fourth nodes, the second DC path circuit arranged to conduct current between the second and fourth nodes.

In some embodiments, the second DC path circuit conducts current from the fourth node to the second node while a voltage of the second node is equal to the first low voltage, and the second DC path circuit is nonconductive while a voltage of the second node is equal to the first high voltage.

In some embodiments, the level shift circuit further includes a first coupling capacitor connected between the first and third nodes, and a second coupling capacitor connected between the second and fourth nodes.

In some embodiments, the first DC path circuit includes a first switch having a first source electrically connected to the first node and a first gate connected to a first power source arranged to provide the first high voltage.

In some embodiments, the first DC path circuit includes a second switch having a second source electrically connected to the third node and a second gate connected to a second power source configured to provide the second high voltage.

In some embodiments, the first DC path circuit includes a third switch having a third source electrically connected to the third node and a third gate electrically connectable to the first node through the first switch.

In some embodiments, the voltage regulator circuit also includes a switching node, and a power switch arranged to selectively electrically connect the switching node to a substantially fixed voltage in response to an input signal from the level shifter circuit.

In some embodiments, the voltage regulator circuit also includes a controller that provides a control signal to the level shifter circuit, where the level shifter circuit generates the input signal for the power switch in response to receiving the control signal from the controller.

Another inventive aspect is a method of operating a voltage regulator circuit including a level shifter circuit, where the level shifter circuit includes first, second, third, and fourth nodes, and a DC path circuit connected between the first and third nodes. The method includes switching voltages of each of the first and second nodes between a first low voltage and a first high voltage, switching voltages of each of the third and fourth nodes between a second low voltage and a second high voltage, where the second high voltage is different than the first high voltage, and, with the DC path circuit, conducting a current between the first and third nodes.

In some embodiments, the method also includes, with the DC path circuit, conducting the current from the third node to the first node while a voltage of the first node is equal to the first low voltage, and not conducting current from the third node to the first node while the voltage of the first node is equal to the first high voltage.

In some embodiments, the DC path circuit is a first DC path circuit and the current is a first current, and where the level shift circuit further includes a second DC path circuit connected between the second and fourth nodes, and where the method further includes, with the second DC path circuit, conducting a second current between the second and fourth nodes.

In some embodiments, the method also includes, with the second DC path circuit, generating an open circuit condition between the fourth node and the second node while a voltage of the second node is equal to the first high voltage.

In some embodiments, the level shift circuit further includes a first coupling capacitor connected between the first and third nodes, and a second coupling capacitor connected between the second and fourth nodes.

In some embodiments, the DC path circuit includes a first switch having a first source electrically connected to the first node and a first gate connected to a first power source configured to provide the first high voltage.

In some embodiments, the DC path circuit includes a second switch having a second source electrically connected to the third node and a second gate connected to a second power source configured to provide the second high voltage.

In some embodiments, the DC path circuit includes a third switch having a third source electrically connected to the third node and a third gate electrically connectable to the first node through the first switch.

In some embodiments, the voltage regulator circuit further includes a switching node, and a power switch, and the method further includes, with the power switch selectively electrically connecting the switching node to a substantially fixed voltage in response to an input signal from the level shifter circuit.

In some embodiments, the voltage regulator circuit further includes a controller, and the method further includes, with the controller, providing a control signal to the level shifter circuit, and, with the level shifter circuit, generating the input signal for the power switch in response to the control signal from the controller.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

When practical, similar reference numbers denote similar structures, features, or elements.

DETAILED DESCRIPTION

Particular embodiments of the invention are illustrated herein in conjunction with the drawings. Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein. For example, certain aspects and principles are discussed with reference to a buck switching power converter. However, as understood by those of ordinary skill in the art, the various aspects and principles may be used in embodiments of other types of switching power converters, such as resonant, boost, buck-boost, and flyback regulators. Furthermore, as understood by those of ordinary skill in the art, while the various aspects and principles are discussed herein with reference to use of a pulse width modulation (PWM) controller, other controllers and control schemes are used in alternative embodiments. In addition, in the embodiments discussed below, MOSFETs are used. However, in some embodiments other transistors or other switches are used.

The invention will be described primarily with a single type of regulator, for clarity. The principles and aspects discussed herein may be applied to other regulator types according to principles understood by those of skill in the art.

Figure 1:
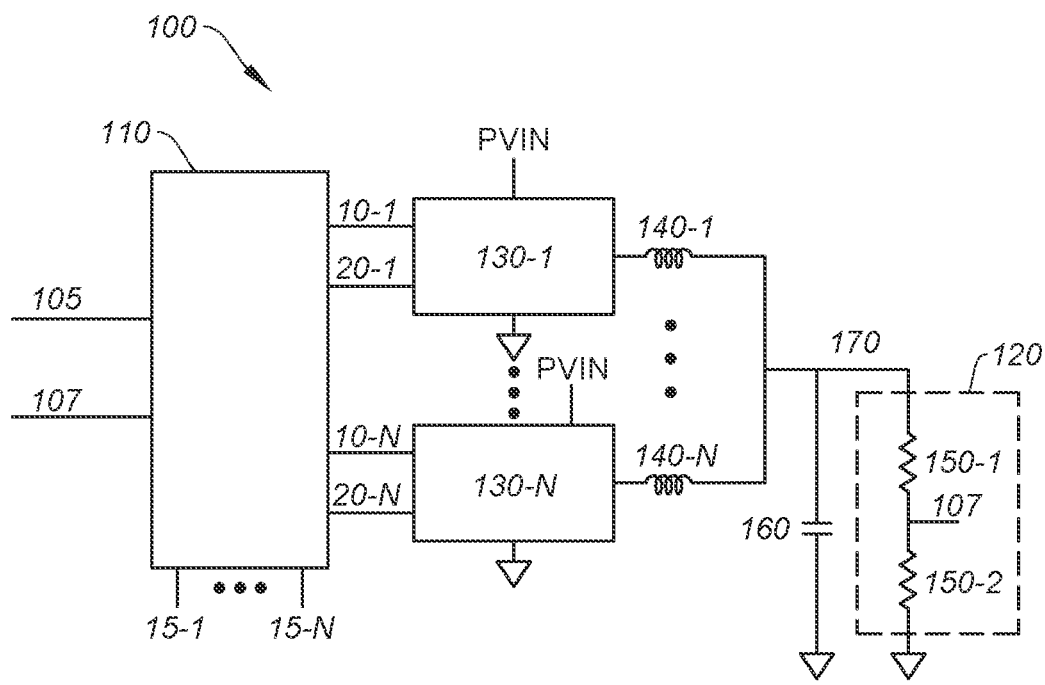
FIG. 1 is a schematic illustration of a multiphase power converter circuit according to some embodiments.
Figure 2:
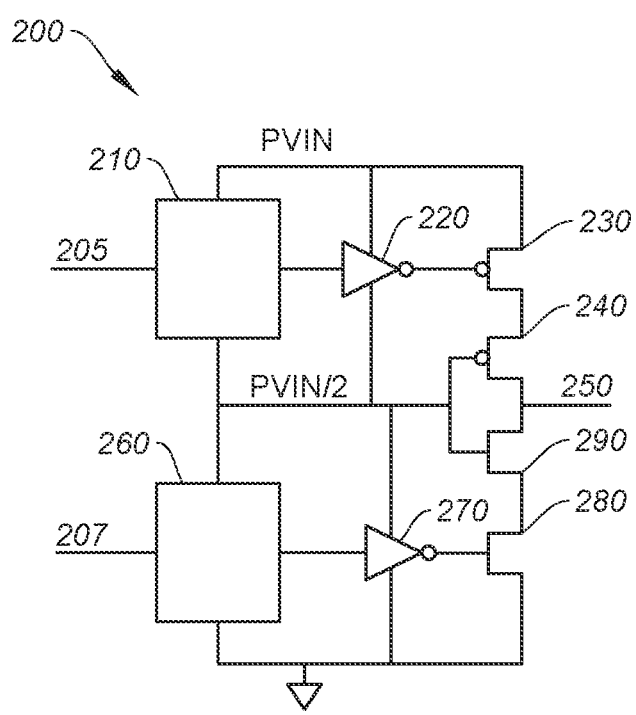
FIG. 2 is a schematic illustration of a phase circuit which may be used in the power converter circuit of FIG. 1.
Figure 3:
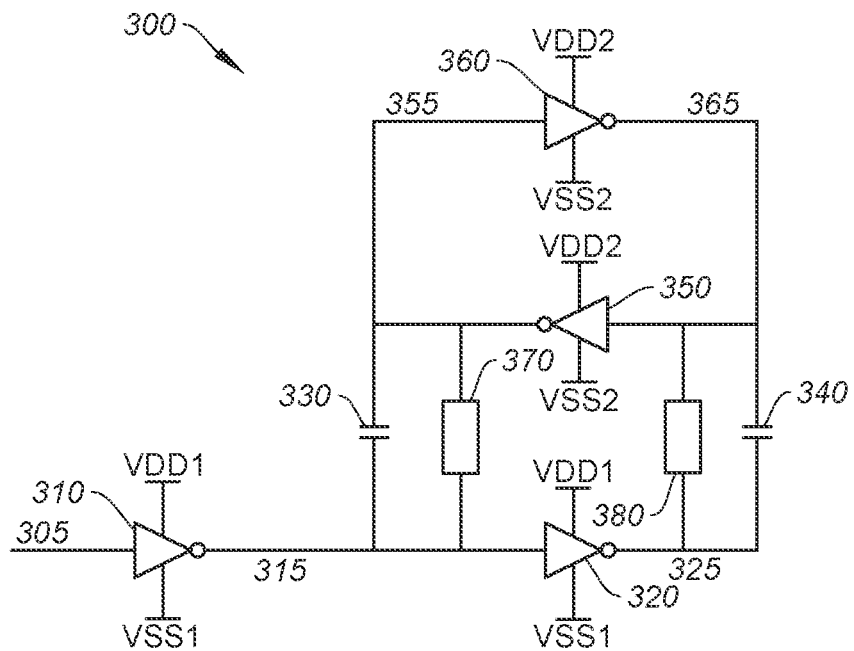
FIG. 3 is a schematic illustration of a level shifter circuit which may be used in the phase circuit of FIG. 2.
Figure 4:
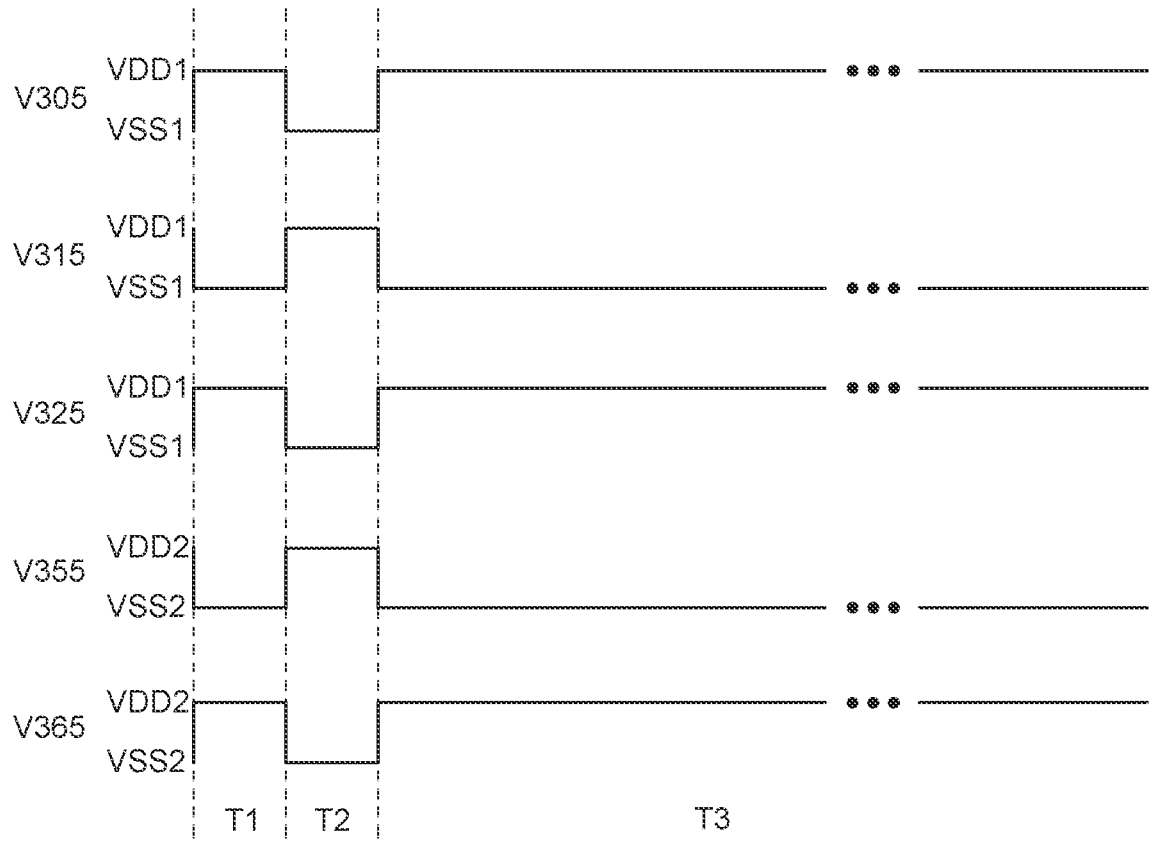
FIG. 4 is a waveform diagram illustrating operation of the level shifter circuit of FIG. 3.
Figures 5, 6:
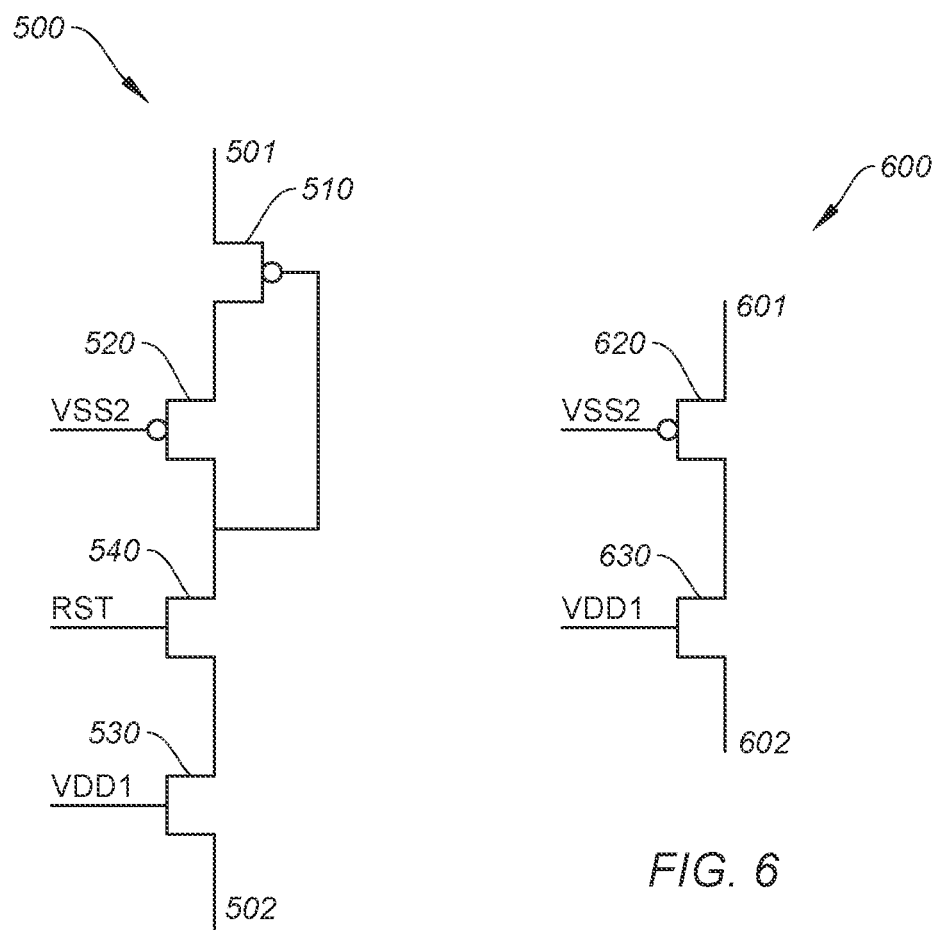
FIG. 5 a schematic illustration of a DC path circuit which may be used in the level shifter circuit of FIG. 3.
FIG. 6 a schematic illustration of a DC path circuit which may be used in the level shifter circuit of FIG. 3.

Embodiments disclosed herein relate to a switching voltage regulator that includes level shifters to convert switching or non-switching control or other signals generated in a first power domain to control signals in a second power domain. The signals may cause high side and low side power switches to be conditionally connected to a switching node to deliver power to a load through one or more inductors. Some embodiments provide examples of level shifter circuits that prevent indeterminate states in control signals of the second power domain. FIGS. 1-3 illustrate a multiphase power converter circuit having phase circuits that include level shifter circuits that prevent indeterminate output states. FIG. 4 illustrates waveforms indicating operation of the level shifter circuit, and FIG. 5 is a schematic illustration of a DC path circuit that may be used in the level shifter circuits. In some embodiments, the DC path of the level shifter autonomously shuts-off when a fast AC path is active. When the AC path is not active, the DC path constantly ensures the correct state of the level shifter. In some embodiments the level shifter circuit is characterized by relatively low power consumption, relatively fast operation, relatively reduced die area and various embodiments of the circuit operate immediately at startup without a need for priming.

FIG. 1 is a schematic illustration of a multiphase power converter circuit 100 according to some embodiments. Multiphase power converter circuit 100 is an example of a switching voltage regulator that is configured to generate an output voltage at output node 170 based on a reference voltage at reference input node 105. Power converter circuit 100 includes a power voltage at power input node PVIN and operate based on a group of multiphase clocks at clock input nodes 15-1 through 15-N.

Multiphase power converter circuit 100 includes controller 110, phase circuits 130-1 through 130-N, inductors 140-1 through 140-N, an output capacitor 160, and a resistor divider 120 comprising resistors 150-1 and 150-2.

In this embodiment, controller 110 generates high side pulses at nodes 10-1 through 10-N and low side pulses at nodes 20-1 through 20-N for the phase circuits 130-1 through 130-N. Each high side pulse is received by a particular phase circuit, and, in response to the high side pulse, the particular phase causes the particular inductor 140-1 through 140-N connected thereto to be electrically connected with power input node PVIN. Each low side pulse is received by a particular phase circuit, and, in response to the low side pulse, the particular phase causes the particular inductor connected thereto to be electrically connected with a ground node.

As understood by those of skill in the art, the synchronous selective electrical connection of each of the inductors with the power input node PVIN and ground causes charge to be delivered to the output capacitor 160, resistor divider 120, and any load connected to output node 170.

Furthermore, controller 110 receives a feedback voltage at feedback node 107, where the voltage value at feedback node 107 is equal to the voltage at output node 170 times the resistance value of resistor 150-1 divided by the sum of the resistance values of resistors 150-1 and 150-2. In addition, using techniques understood by those of skill in the art, controller 110 generates the high side pulses and the low side pulses based partly on a difference between the feedback voltage at feedback node 107 and the reference voltage at reference input node 105. As a result, based on feedback principles understood by those of skill in the art, the voltage at the output node 170 is maintained by multiphase power converter circuit 100 to be about equal to the reference voltage at reference input node 105 divided by the resistance value of resistor 150-1 times the sum of the resistance values of resistors 150-1 and 150-2. However, as appreciated by one of ordinary skill in the art, other embodiments can use a different suitable feedback control circuit.

The relative timing of the high side pulses and the low side pulses delivered to the phase circuits 130-1 through 130-N is determined based on the multiphase clocks received by a controller 110 at clock input nodes 15-1 through 15-N. For example, in one embodiment multiphase clocks are separated in phase by a fixed amount of phase (e.g., 360°/N), thus the high side pulses and the low side pulses are also separated in phase. For example, the high side pulses and the low side pulses may be separated by the same fixed amount of phase. As a result, the charge pulses delivered by phase circuits 130-1 through 130-N to the output node 170 are also separated by the same fixed amount of phase.

FIG. 2 is a schematic illustration of a phase circuit 200 that may be used in the power converter circuit 100 of FIG. 1. Instantiations of phase circuit 200 may be used as the phase circuits 130-1 through 130-N. Phase circuit 200 may be used in other types of switching power converter circuits. In addition, other phase circuits may be used as the phase circuits 130-1 through 130-N of the power converter circuit 100.

Phase circuit 200 receives high side pulses at input node 205 and receives low side pulses at input node 207. Based on the received high side and low side pulses, and on the power voltage at power input node PVIN, phase circuit 200 selectively connects switch node 250 to either the power input node PVIN or the ground node.

Phase circuit 200 includes high side level shifter circuit 210, high side power switch driver 220, high side power switches 230 and 240, low side level shifter circuit 260, low side power switch driver 270, and low side power switches 280 and 290.

High side level shifter circuit 210 receives high side pulses from a controller having features similar or identical to controller 110, discussed above. In response to the high side pulses, high side level shifter circuit 210 generates high side control signals for high side power switch driver 220.

The high side pulses are generated by the controller in a first power domain. As used herein a power domain indicates a particular voltage level with respect to ground. For example, the high side pulses may switch between a first low voltage and a first high voltage. For example, the first low voltage may be 0 V, or the ground voltage, and the first high voltage may be 0.9 V. Other voltage values may be used for the first low voltage and first high voltage, as understood by those of skill in the art.

The high side level shifter circuit 210 receives the high side pulses in the first power domain, and generates the high side control signals for the high side power switch driver 220 in a second power domain. For example, the high side control signals between a second low voltage and a second high voltage. For example, the second low voltage may be 0.9 V, and the second bias voltage may be 1.8 V. Other voltage values may be used for the second low voltage and the second high voltage, as understood by those of skill in the art.

High side power switch driver 220 receives the high side control signals from high side level shifter circuit 210 and generates high side power switch gate signals which directly control the conductivity of high side power switch 230. In addition, the high side power switch gate signals indirectly control the conductivity of high side power switch 240, as understood by those of skill in the art. Accordingly, the high side power switch gate signals selectively connect the switch node 250 with power input node PVIN.

Low side level shifter circuit 260 receives low side pulses from a controller having features similar or identical to controller 110, discussed above. In response to the low side pulses, low side level shifter circuit 260 generates low side control signals for low side power switch driver 270.

The low side pulses are generated by the controller in a first power domain. For example, the low side pulses may switch between a first low voltage and a first high voltage. For example, the first low voltage may be 0 V, or the ground voltage, and the first high voltage may be 0.9 V. Other voltage values may be used for the first low voltage and the first high voltage, as understood by those of skill in the art.

In some embodiments, the low side level shifter circuit 260 receives the low side pulses in the first power domain, and generates the low side control signals for the low side power switch driver 270 in the same first power domain.

In some embodiments, the low side level shifter circuit 260 receives the low side pulses in the first power domain, and generates the low side control signals for the low side power switch driver 220 in a second power domain. For example, the low side control signals may switch between a second low voltage and a second high voltage. For example, the second low voltage may be 0 V, and the second high voltage may be 1.5 V. Other voltage values may be used for the second low voltage and the second high voltage, as understood by those of skill in the art.

Low side power switch driver 270 receives the low side control signals from low side level shifter circuit 260 and generates low side power switch gate signals which directly control the conductivity of low side power switch 280. In addition, the low side power switch gate signals indirectly control the conductivity of low side power switch 290, as understood by those of skill in the art. Accordingly, the low side power switch gate signals selectively connect the switch node 250 with the ground node.

FIG. 3 is a schematic illustration of a level shifter circuit 300 which may be used in the phase circuit of FIG. 2. Instantiations of level shifter circuit 300 may be used as either or both of high side level shifter 210 and low side level shifter 260. Other level shifter circuits may be used in the phase circuit of FIG. 2. In addition, level shifter circuit 300 may be used in other phase circuits. Level shifter circuit 300 may additionally or alternatively be used in other level shifting applications.

In some embodiments, one or more instantiations of level shifter circuit 300 may be used as a high side level shifter and/or a low side level shifter in a switching power voltage regulator which is not multiphase, but, for example, instead has only a single phase circuit.

Level shifter circuit 300 includes primary and secondary first power domain inverters 310 and 320, first and second coupling capacitors 330 and 340, second power domain inverters 350 and 360, and first and second DC path circuits 370 and 380.

The input of the primary first power domain inverter 310 at node 305 is connected to, for example, a controller configured to generate pulse signals for the level shift circuit 300. The output of the primary first power domain inverter 310 at node 315 is connected with the input of the secondary first power domain inverter 320. The outputs of primary and secondary first power domain inverters 310 and 320 at nodes 315 and 325 are respectively connected with first and second coupling capacitors 330 and 340, and first and second DC path circuits 370 and 380.

First and second coupling capacitors 330 and 340 are respectively connected with the output and the input of second power domain inverter 350 at nodes 355 and 365. First and second coupling capacitors 330 and 340 are also respectively connected with the input and the output of second power domain inverter 360 at nodes 355 and 365. In addition, first and second DC path circuits 370 and 380 are respectively connected in parallel with the first and second coupling capacitors 330 and 340.

FIG. 4 is a waveform diagram illustrating operation of the level shifter circuit 300 of FIG. 3. At the beginning of time T1, an input signal V305 received at the input of primary first power domain inverter 310 at node 305 transitions from the first low voltage VSS1 of the first power domain to the first high voltage VDD1 of the first power domain. The input signal may be generated, for example, by a controller, such as controller 110. In response to the transition of the input signal, primary first power domain inverter 310 causes a first signal V315 at its output at node 315 to transition from the first high voltage VDD1 to the first low voltage VSS1. In response to the transition in the first signal at node 315, secondary first power domain inverter 320 causes a second signal V325 at its output at node 325 to transition from the first low voltage VSS1 to the first high voltage VDD1.

In response to the first signal at node 315 transitioning from the first high voltage VDD1 to the first low voltage VSS1, first coupling capacitor 330 causes the voltage V355 at node 355 to transition from the second high voltage VDD2 of the second power domain to or toward the second low voltage VSS2 of the second power domain. In addition, in response to the second signal at node 325 transitioning from the first low voltage VSS1 to the first high voltage VDD1, second coupling capacitor 340 causes the voltage V365 at node 365 to transition from the second low voltage VSS2 of the second power domain to or toward the second high voltage VDD2 of the second power domain.

In response to the voltage at node 355 transitioning from the second high voltage VDD2 to or toward the second low voltage VSS2, and the voltage at node 365 transitioning from the second low voltage VSS2 to or toward the second high voltage VDD2, second power domain inverters 350 and 360 cause the voltages at nodes 355 and 365 to be equal or substantially equal to the second low voltage VSS2 and the second high voltage VDD2, respectively.

During time T1, first DC path circuit 370 conducts current from node 355 to node 315. The amount of current first DC path circuit 370 conducts is equal to (the voltage at node 355 minus the voltage at node 315) divided by the DC impedance of the first DC path circuit 370.

During time T1, second DC path circuit 380 may conduct current from node 365 to node 325. The amount of current second DC path circuit 380 conducts is equal or about equal to (the second high voltage VDD2 minus the first high voltage VDD1) divided by the DC impedance of the second DC path circuit 380. In some embodiments, during time T1, second DC path circuit 380 does not conduct current from node 365 to node 325.

At the beginning of time T2, the input signal received at the input of primary first power domain inverter 310 at node 305 transitions from the first high voltage VDD1 of the first power domain to the first low voltage VSS1 of the first power domain. In response to the transition of the input signal, primary first power domain inverter 310 causes the first signal at its output at node 315 to transition from the first low voltage VSS1 to the first high voltage VDD1. In response to the transition in the first signal at node 315, secondary first power domain inverter 320 causes the second signal its output at node 325 to transition from the first high voltage VDD1 to the first low voltage VSS1.

In response to the first signal at node 315 transitioning from the first low voltage VSS1 to the first high voltage VDD1, first coupling capacitor 330 causes the voltage at node 355 to transition from the second low voltage VSS2 of the second power domain to or toward the second high voltage VDD2 of the second power domain. In addition, in response to the second signal at node 325 transitioning from the first high voltage VDD1 to the first low voltage VSS1, second coupling capacitor 340 causes the voltage at node 365 to transition from the second high voltage VDD2 of the second power domain to or toward the second low voltage VSS2 of the second power domain.

In response to the voltage at node 355 transitioning from the second low voltage VSS2 to or toward the second high voltage VDD2, and the voltage at node 365 transitioning from the second high voltage VDD2 to or toward the second low voltage VSS2, first and second power domain inverters 350 and 360 cause the voltages at nodes 355 and 365 to be equal or substantially equal to the second high voltage VDD2 and the second low voltage VSS2, respectively.

During time T2, first DC path circuit 370 may conduct current from node 355 to node 315. The amount of current first DC path circuit 370 conducts is equal to (the voltage at node 355 minus the voltage at node 315) divided by the DC impedance of the first DC path circuit 370. In some embodiments, during time T2, first DC path circuit 370 does not conduct current from node 355 to node 315.

During time T2, second DC path circuit 380 conducts current from node 365 to node 325. The amount of current second DC path circuit 380 conducts is equal to (the voltage at node 365 minus the voltage at node 325) divided by the DC impedance of the second DC path circuit 380.

At the beginning of time T3, the input signal received at the input of primary first power domain inverter 310 at node 305 transitions from the first low voltage VSS1 to the first high voltage VDD1. In response to the transition of the input signal, the voltage at node 315 transitions from the first high voltage VDD1 to the first low voltage VSS1, and the voltage at node 325 transitions from the first low voltage VSS1 to the first high voltage VDD1. In addition, the voltage at node 355 transitions from the second high voltage VDD2 to the second low voltage VSS2, and the voltage at node 365 transitions from the second low voltage VSS2 to the second high voltage VDD2.

As discussed above, the capacitive coupling of first and second coupling capacitors 330 and 340 cause transitions in the voltages at nodes 355 and 365. In addition, cross coupled second power domain inverters 350 and 360 hold the voltages at nodes 355 and 365, as understood by those of skill in the art. However, should sufficient noise be coupled to nodes 355 and 365, cross coupled second power domain inverters 350 and 360 may cause the voltages at nodes 355 and 365 to transition to and be held at opposite undesired states. The likelihood of such noise coupling is increased during long periods of the input signal being fixed, such as that illustrated as time T3.

As understood by those of skill in the art, in order for the noise to cause the voltages at nodes 355 and 365 to transition to opposite states, the noise should cause the voltages at nodes 355 and 365 to at least become about equal to, so as to transition past one or both threshold voltages of cross coupled second power domain inverters 350 and 300.

Because first and second coupling capacitors 330 and 340 only provide AC paths from the outputs of primary and secondary first power domain inverters 310 and 320, first and second DC path circuits 370 and 380 are beneficial as they significantly help cross coupled second power domain inverters 350 and 360 maintain the voltages at nodes 355 and 365 at their desired states. In some embodiments, first and second DC path circuits 370 and 380 prevent the noise from causing cross coupled second power domain inverters 350 and 360 to switch states.

During time T3, a noise event threatening to cause the voltages at nodes 355 and 365 transition to opposite states causes the voltage at node 355 to increase and causes the voltage at node 365 to decrease.

In some embodiments, first and second DC path circuits 370 and 380 are each configured to be conductive when the voltage at their terminal connected to secondary first domain inverter 320 is equal to the first low voltage VSS1. In some embodiments, first and second DC path circuits 370 and 380 are each configured to be nonconductive when the voltage at their terminal connected to secondary first domain inverter 320 is equal or about equal to the first high voltage VDD1.

In such embodiments, during time T3, first DC path circuit 370 helps cross coupled second power domain inverters 350 and 360 maintain the voltages at nodes 355 and 365 at their desired states by providing a DC current path form node 355 to the first low voltage VSS1. In some embodiments, during time T3, first DC path circuit 370 conducts current from node 355 to node 315, and second DC path circuit 380 conducts current from node 365 to node 325. In some embodiments, during time T3, second DC path circuit 380 does not conduct current from node 365 to node 325.

The amount of current first DC path circuit 370 conducts is equal to (the voltage at node 355 minus the voltage at node 315) divided by the DC impedance of the first DC path circuit 370. The amount of current second DC path circuit 380 conducts, if conducting, is equal to (the voltage at node 365 minus the voltage at node 325) divided by the DC impedance of the second DC path circuit 380.

As a result, the differential effect of the first and second DC path circuits 370 and 380 is to reduce the voltage at node 355 and possibly to increase the voltage at node 365. Thus, the combined effect of the first and second DC path circuits 370 and 380 is to resist and reduce the effect of the threatening noise event, such that cross coupled second power domain inverters 350 and 360 more effectively hold the voltages at nodes 355 and 365. Accordingly, the noise event causes the current through the first DC path circuit 370 to increase, and may cause the current through the second DC path circuit 380 to decrease.

In some embodiments, level shifter circuit 300 is configured to receive a reset signal that forces the cross coupled second power domain inverters 350 and 360 to cause the voltages at nodes 355 and 365 to have a known state. For example, a PMOS device (not shown) may be connected between a particular one of nodes 355 and 365 and the supply node of the second high voltage VDD2, and may be configured to receive, at its gate node, a reset signal of the second power domain that selectively causes the cross coupled second power domain inverters 350 and 360 to hold the voltage of the particular one of nodes 355 and 365 to the second high voltage VDD2. Alternatively, an NMOS device may be connected between a particular one of nodes 355 and 365 and the supply node of the second low voltage VSS2, and may be configured to receive, at its gate node, a reset signal of the second power domain that selectively causes the cross coupled second power domain inverters 350 and 360 to hold the voltage of the particular one of nodes 355 and 365 to the second low voltage VSS2.

In some embodiments, a PMOS device (not shown) may be connected between a particular one of nodes 315 and 325 and the supply node of the first high voltage VDD1, and may be configured to receive, at its gate node, a reset signal of the first power domain that selectively causes the primary and secondary first power domain inverters 310 and 320 to hold the voltage of the particular one of nodes 315 and 325 to the first high voltage VDD1. Alternatively, an NMOS device may be connected between a particular one of nodes 315 and 325 and the supply node of the first low voltage VSS1, and may be configured to receive, at its gate node, a reset signal of the first power domain that selectively causes the primary and secondary first power domain inverters 310 and 320 to hold the voltage of the particular one of nodes 315 and 325 to the first low voltage VSS1.

In some embodiments, DC path circuits 370 and 380 each comprise one or more transistors configured to provide a current path between secondary first power domain inverter 320 and second power the main domain inverter 350. In some embodiments, DC path circuits 370 and 380 each comprise one or more transistors configured to receive a signal so as to selectively provide a current path between secondary first power domain inverter 320 and second power the main domain inverter 350. In some embodiments, DC path circuits 370 and 380 each comprise a resistor or a diode connected to secondary first power domain inverter 320 and second power the main domain inverter 350.

FIG. 5 is a schematic illustration of a DC path circuit 500 that may be used in the level shifter circuit 300 of FIG. 3. Instantiations of DC path circuit 500 may be used as DC path circuits 370 and 380 of level shifter circuit 300. Other DC path circuits may be used in level shifter circuit 300. In addition, DC path circuit 500 may be used in other level shifter circuits.

In the embodiment of FIG. 5, DC path circuit 500 includes a plurality of transistors configured to provide a DC current path between terminals 501 and 502.

DC path circuit 500 includes first PMOS transistor 510, second PMOS transistor 520, first NMOS transistor 530, and second NMOS transistor 540. In some embodiments, second PMOS 520 transistor is a low threshold device, as understood by those of skill in the art. In some embodiments, first PMOS transistor 510, second PMOS transistor 520, and first NMOS transistor 530 are core transistors, as understood by those of skill in the art. In some embodiments, second NMOS transistor 540 is an I/O transistor, as understood by those of skill in the art. For example, one or more of breakdown voltages, oxide thickness, and transistor length may be greater in the I/O transistors than in the core transistors.

The gate of first PMOS transistor 510 is connected to the drain of second PMOS transistor 520, so that while the voltage at terminal 501 is more than one threshold voltage greater than the voltage at the drain of second PMOS transistor 520, the first PMOS transistor 510 is conductive.

The gate of second PMOS transistor 520 is connected to the supply node of the second low voltage VSS2, so that while the voltage at the source of second PMOS transistor 520 is more than one threshold voltage greater than the second low voltage VSS2, the second PMOS transistor 520 is conductive.

The gate of first NMOS transistor 530 is connected to the first high voltage VDD1. Accordingly, the first NMOS transistor 530 is conductive when the voltage at terminal 502 is more than one threshold voltage less than the first high voltage VDD1.

The gate of second NMOS transistor 540 is connected to a reset signal at node RST in the first power domain. Accordingly, while the voltage of the reset signal at node RST is equal to the first high voltage VDD1, the second NMOS transistor 540 is conductive, and while the voltage of the reset signal at node RST is equal to the first low voltage VSS1 of the second NMOS transistor 540 is nonconductive.

Accordingly, when DC path circuit 500 is used in level shifter circuit 300, during time T3, illustrated in FIG. 4, while the voltage at terminal 502 is equal to the first low voltage VSS1 and the voltage at terminal 501 is equal to the second low voltage VSS2, DC path circuit 500 becomes conductive if the voltage at terminal 501 becomes greater than the second low voltage VSS2 plus the threshold voltage of second PMOS transistor 520, and helps prevent the voltage at terminal 501 from rising enough to cause the voltages at nodes 355 and 365 to undesirably change states, for example, as a result of noise.

In addition, when DC path circuit 500 is used in level shifter circuit 300, during time T3, while the voltage at terminal 502 is equal to the first high voltage VDD1 and the voltage at terminal 501 is equal to the second high voltage VDD2, DC path circuit 500 is nonconductive, and helps or at least does not hurt the prevention of the voltage at terminal 501 from reducing enough to cause the voltages at nodes 355 and 365 to undesirably change states, for example, as a result of noise.

In the example of DC path circuit 500, four transistors are used. Accordingly, even in a worst-case scenario, where the voltage at terminal 502 is equal to the first low voltage VSS1, and the voltage at terminal 501 is equal to the second high voltage VDD2, the voltage difference between the second high voltage VDD2 and the first low voltage VSS1 is distributed among the Vds's of the four transistors, such that none of the four transistors experiences a Vds, Vgs, or Vdg overvoltage.

In some embodiments of level shifter circuit 300, the DC path circuits 370 and 380 and the second power domain inverters 350 and 360 are sized such that, without an outside influence, such as noise, the DC path circuit 370 or 380 having its terminal 502 connected to the first low voltage VSS1 has a low enough impedance to cause the voltage at its terminal 501 to become equal or about equal to the second low voltage VSS2 plus the threshold voltage of second PMOS transistor 520. Accordingly, in such embodiments, once a noise event causing or threatening to cause an undesirable state change in the voltages at nodes 355 and 365 ceases, DC path circuits 370 and 380 cause the voltages at nodes 355 and 365 to remain or become equal to the desired logic state voltages, for example, corresponding with the logic state voltages at nodes 315 and 325.

FIG. 6 is a schematic illustration of a DC path circuit 600 that may be used in the level shifter circuit 300 of FIG. 3. Instantiations of DC path circuit 600 may be used as DC path circuits 370 and 380 of level shifter circuit 300. Other DC path circuits may be used in level shifter circuit 300. In addition, DC path circuit 600 may be used in other level shifter circuits.

In the embodiment of FIG. 6, DC path circuit 600 includes PMOS transistor 620, and NMOS transistor 630. In some embodiments, PMOS transistor 620 is a low threshold device, as understood by those of skill in the art. In some embodiments, PMOS transistor 620 is a core transistor, as understood by those of skill in the art. In some embodiments, NMOS transistor 630 is an I/O transistor, as understood by those of skill in the art. For example, one or more of breakdown voltages, oxide thickness, and transistor length may be greater in the I/O transistors than in the core transistors.

The gate of PMOS transistor 620 is connected to the supply node of the second low voltage VSS2, so that while the voltage at the source of second PMOS transistor 620 is more than one threshold voltage greater than the second low voltage VSS2, the PMOS transistor 620 is conductive. The gate of NMOS transistor 630 is connected to the first high voltage VDD1. Accordingly, the NMOS transistor 630 is conductive when the voltage at terminal 602 is more than one threshold voltage less than the first high voltage VDD1.

Accordingly, when DC path circuit 600 is used in level shifter circuit 300, during time T3, illustrated in FIG. 4, while the voltage at terminal 602 is equal to the first low voltage VSS1 and the voltage at terminal 601 is equal to the second low voltage VSS2, DC path circuit 600 becomes conductive if the voltage at terminal 601 becomes greater than the second low voltage VSS2 plus the threshold voltage of second PMOS transistor 620, and helps prevent the voltage at terminal 601 from rising enough to cause the voltages at nodes 355 and 365 to undesirably change states, for example, as a result of noise.

In addition, when DC path circuit 600 is used in level shifter circuit 300, during time T3, while the voltage at terminal 602 is equal to the first high voltage VDD1 and the voltage at terminal 601 is equal to the second high voltage VDD2, DC path circuit 600 is nonconductive, and helps or at least does not hurt the prevention of the voltage at terminal 601 from reducing enough to cause the voltages at nodes 355 and 365 to undesirably change states, for example, as a result of noise.

In the example of DC path circuit 600, two transistors are used. Accordingly, where the voltage at terminal 602 is equal to the first low voltage VSS1, and the voltage at terminal 601 is equal to the second high voltage VDD2, the voltage difference between the second high voltage VDD2 and the first low voltage VSS1 is distributed among the Vds's of the two transistors, such that neither of the transistors experiences a Vds, Vgs, or Vdg overvoltage.

FIGS. 5 and 6 show two examples of DC path circuits, however, as appreciated by one of skill in the art this disclosure is not limited to these circuits and other suitable circuits can be used that include combinations of a lesser number of transistors, a greater number of transistors, different types and/or configurations of transistors, combinations of transistors and diodes and the like.

Though the present invention is disclosed by way of specific embodiments as described above, those embodiments are not intended to limit the present invention. Based on the methods and the technical aspects disclosed above, variations and changes may be made to the presented embodiments by those skilled in the art without departing from the spirit and the scope of the present invention.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on,"

above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

What is claimed is:

1. A voltage regulator circuit, comprising a level shifter circuit, wherein the level shifter circuit comprises:
    first and second nodes that each switch between a first low voltage and a first high voltage;
    third and fourth nodes that each switch between a second low voltage and a second high voltage, wherein the second high voltage is different from the first high voltage; and
    a DC path circuit connected between the first and third nodes, and arranged to selectively conduct a current between the first and third nodes,
    wherein the DC path circuit conducts the current from the third node to the first node while a voltage of the first node is equal to the first low voltage.

2. The voltage regulator circuit of claim 1, wherein the DC path circuit is arranged to be nonconductive while the voltage of the first node is equal to the first high voltage.

3. The voltage regulator circuit of claim 1, wherein the DC path circuit is a first DC path circuit, and wherein the level shift circuit further comprises a second DC path circuit that is connected between the second and fourth nodes, the second DC path circuit arranged to conduct current between the second and fourth nodes.

4. The voltage regulator circuit of claim 3, wherein the second DC path circuit conducts current from the fourth node to the second node while a voltage of the second node is equal to the first low voltage, and wherein the second DC path circuit is nonconductive while a voltage of the second node is equal to the first high voltage.

5. The voltage regulator circuit of claim 1, wherein the level shift circuit further comprises:
    a first coupling capacitor connected between the first and third nodes; and
    a second coupling capacitor connected between the second and fourth nodes.

6. The voltage regulator circuit of claim 1, wherein a first DC path circuit comprises a first switch having a first source electrically connected to the first node and a first gate connected to a first power source arranged to provide the first high voltage.

7. The voltage regulator circuit of claim 6, wherein the first DC path circuit comprises a second switch having a second source electrically connected to the third node and a second gate connected to a second power source configured to provide the second high voltage.

8. The voltage regulator circuit of claim 7, wherein the first DC path circuit comprises a third switch having a third source electrically connected to the third node and a third gate electrically connectable to the first node through the first switch.

9. The voltage regulator circuit of claim 1, further comprising:
    a switching node; and
    a power switch arranged to selectively electrically connect the switching node to a fixed voltage in response to an input signal from the level shifter circuit.

10. The voltage regulator circuit of claim 9, further comprising a controller that provides a control signal to the level shifter circuit, wherein the level shifter circuit generates the input signal for the power switch in response to receiving the control signal from the controller.

11. A method of operating a voltage regulator circuit comprising a level shifter circuit, wherein the level shifter circuit comprises first, second, third, and fourth nodes, and a DC path circuit connected between the first and third nodes, the method comprising:
    switching voltages of each of the first and second nodes between a first low voltage and a first high voltage;
    switching voltages of each of the third and fourth nodes between a second low voltage and a second high voltage, wherein the second high voltage is different than the first high voltage; and
    with the DC path circuit, conducting a current between the first and third nodes while a voltage of the first node is equal to the first low voltage.

12. The method of claim 11, further comprising, with the DC path circuit, not conducting current from the third node to the first node while the voltage of the first node is equal to the first high voltage.

13. The method of claim 11, wherein the DC path circuit is a first DC path circuit and the current is a first current, and wherein the level shift circuit further comprises a second DC path circuit connected between the second and fourth nodes, and wherein the method further comprises, with the second DC path circuit, conducting a second current between the second and fourth nodes.

14. The method of claim 13, further comprising, with the second DC path circuit, generating an open circuit condition between the fourth node and the second node while a voltage of the second node is equal to the first high voltage.

15. The method of claim 11, wherein the level shift circuit further comprises:
    a first coupling capacitor connected between the first and third nodes; and
    a second coupling capacitor connected between the second and fourth nodes.

16. The method of claim 11, wherein the DC path circuit comprises a first switch having a first source electrically connected to the first node and a first gate connected to a first power source configured to provide the first high voltage.

17. The method of claim 16, wherein the DC path circuit comprises a second switch having a second source electrically connected to the third node and a second gate connected to a second power source configured to provide the second high voltage.

18. The method of claim 17, wherein the DC path circuit comprises a third switch having a third source electrically connected to the third node and a third gate electrically connectable to the first node through the first switch.

19. The method of claim 11, wherein the voltage regulator circuit further comprises a switching node, and a power switch, wherein the method further comprises, with the power switch selectively electrically connecting the switching node to a fixed voltage in response to an input signal from the level shifter circuit.

20. The method of claim 19, wherein the voltage regulator circuit further comprises a controller, and wherein the method further comprises:
   with the controller, providing a control signal to the level shifter circuit; and
   with the level shifter circuit, generating the input signal for the power switch in response to the control signal from the controller.

\* \* \* \* \*